(12) United States Patent
Briere

(10) Patent No.: US 9,525,052 B2
(45) Date of Patent: Dec. 20, 2016

(54) ACTIVE AREA SHAPING OF III-NITRIDE DEVICES UTILIZING A FIELD PLATE DEFINED BY A DIELECTRIC BODY

(71) Applicant: International Rectifier Corporation, El Segundo, CA (US)

(72) Inventor: Michael A. Briere, Scottsdale, AZ (US)

(73) Assignee: Infineon Technologies Americas Corp., El Segundo, CA (US)

( * ) Notice: Subject to any disclaimer, the term of this patent is extended or adjusted under 35 U.S.C. 154(b) by 0 days.

(21) Appl. No.: 14/081,869

(22) Filed: Nov. 15, 2013

(65) Prior Publication Data

US 2014/0097471 A1   Apr. 10, 2014

Related U.S. Application Data

(63) Continuation-in-part of application No. 13/965,421, filed on Aug. 13, 2013, which is a continuation of application No. 13/721,573, filed on Dec. 20, 2012, now Pat. No. 8,536,624, which is a continuation of application No. 12/008,190, filed on Jan. 9, 2008, now Pat. No. 8,338,861.

(60) Provisional application No. 60/884,272, filed on Jan. 10, 2007.

(51) Int. Cl.
| H01L 29/778 | (2006.01) |
| H01L 21/28 | (2006.01) |
| H01L 29/423 | (2006.01) |
| H01L 29/66 | (2006.01) |
| H01L 29/40 | (2006.01) |
| H01L 29/20 | (2006.01) |
| H01L 29/51 | (2006.01) |

(52) U.S. Cl.
CPC ....... *H01L 29/778* (2013.01); *H01L 21/28264* (2013.01); *H01L 29/402* (2013.01); *H01L 29/42376* (2013.01); *H01L 29/66462* (2013.01); *H01L 29/7786* (2013.01); *H01L 29/2003* (2013.01); *H01L 29/518* (2013.01); *H01L 2924/0002* (2013.01)

(58) Field of Classification Search
CPC ............................. H01L 29/778; H01L 29/404
USPC .................................................. 257/194, 488
See application file for complete search history.

(56) References Cited

U.S. PATENT DOCUMENTS

| 7,075,125 B2* | 7/2006 | Saito et al. .................... 257/194 |
| 8,049,252 B2 | 11/2011 | Smith |
| 8,524,601 B2* | 9/2013 | Kurahashi et al. ........... 438/674 |
| 2006/0202272 A1 | 9/2006 | Wu et al. |
| 2007/0018199 A1* | 1/2007 | Sheppard et al. ............ 257/200 |
| 2009/0189187 A1* | 7/2009 | Briere et al. .................. 257/192 |
| 2011/0057257 A1 | 3/2011 | Park |

(Continued)

*Primary Examiner* — Mark Prenty
(74) *Attorney, Agent, or Firm* — Murphy, Bilak & Homiller, PLLC

(57) ABSTRACT

In an exemplary implementation, a III-nitride semiconductor device includes a III-nitride heterojunction including a first III-nitride body situated over a second III-nitride body to form a two-dimensional electron gas. The III-nitride semiconductor device further includes a gate well formed in a dielectric body, the dielectric body situated over the III-nitride heterojunction. The III-nitride semiconductor device also includes a gate arrangement situated in the gate well and including a gate electrode and a field plate. The field plate includes at least two steps, the at least two steps being defined in the dielectric body.

17 Claims, 7 Drawing Sheets

(56) References Cited

U.S. PATENT DOCUMENTS

2012/0223319 A1  9/2012  Dora
2012/0267687 A1  10/2012  Jeon
2014/0077266 A1* 3/2014  Ramdani et al. ............. 257/194

* cited by examiner

ACTIVE AREA SHAPING OF III-NITRIDE DEVICES UTILIZING A FIELD PLATE DEFINED BY A DIELECTRIC BODY

The present application is a continuation-in-part of U.S. patent application Ser. No. 13/965,421, filed on Aug. 13, 2013, which itself is a continuation of U.S. patent application Ser. No. 13/721,573, filed on Dec. 20, 2012, which in turn is a continuation of U.S. patent application Ser. No. 12/008,190, filed on Jan. 9, 2008, which claims priority to U.S. provisional application 60/884,272, filed on Jan. 10, 2007. The present application claims the benefit of and priority to all of the above-identified applications; and the disclosures of all of the above-identified applications are hereby fully incorporated by reference into the present application.

BACKGROUND

I. Definitions

As used herein, the phrase "group III-V" refers to a compound semiconductor including at least one group III element and at least one group V element. By way of example, a group III-V semiconductor may take the form of a III-Nitride semiconductor. "III-Nitride", or "III-N", refers to a compound semiconductor that includes nitrogen and at least one group III element such as aluminum (Al), gallium (Ga), indium (In), and boron (B), and including but not limited to any of its alloys, such as aluminum gallium nitride ($Al_xGa_{(1-x)}N$), indium gallium nitride ($In_yGa_{(1-y)}N$), aluminum indium gallium nitride ($Al_xIn_yGa_{(1-x-y)}N$), gallium arsenide phosphide nitride ($GaAs_aP_bN_{(1-a-b)}$), aluminum indium gallium arsenide phosphide nitride ($Al_xIn_yGa_{(1-x-y)}As_aP_bN_{(1-a-b)}$), for example. III-Nitride also refers generally to any polarity including but not limited to Ga-polar, N-polar, semi-polar, or non-polar crystal orientations. A III-Nitride material may also include either the Wurtzitic, Zincblende, or mixed polytypes, and may include single-crystal, monocrystalline, polycrystalline, or amorphous structures. Gallium nitride or GaN, as used herein, refers to a III-Nitride compound semiconductor wherein the group III element or elements include some or a substantial amount of gallium, but may also include other group III elements in addition to gallium.

II. Background Art

A III-nitride heterojunction semiconductor device can include a III-nitride heterojunction having a first III-nitride body of one bandgap and a second III-nitride body of another bandgap formed over the first III-nitride body. The composition of the first and second III-nitride bodies are selected to cause the formation of a carrier rich region referred to as a two-dimensional electron gas (2DEG) at or near the III-nitride heterojunction. The 2DEG can serve as a conduction channel between a first power electrode (e.g. a source electrode) and a second power electrode (e.g. a drain electrode).

The III-nitride heterojunction semiconductor device can also include a gate electrode disposed between the first and second power electrodes to selectively interrupt or restore the 2DEG therebetween, whereby the device may be operated as a switch. The gate electrode may be received by a trench that extends through a passivation body. The trench in which the gate electrode is received includes vertical sidewalls that form sharp bottom corners in the gate electrode. This can result in high electric field regions at the bottom corners of the gate electrode, as well as an increase in the overlap between the gate electrode and the 2DEG.

SUMMARY

Active area shaping of III-nitride devices utilizing a field plate defined by a dielectric body, substantially as shown in and/or described in connection with at least one of the figures, and as set forth more completely in the claims.

DETAILED DESCRIPTION

Figure 1A:
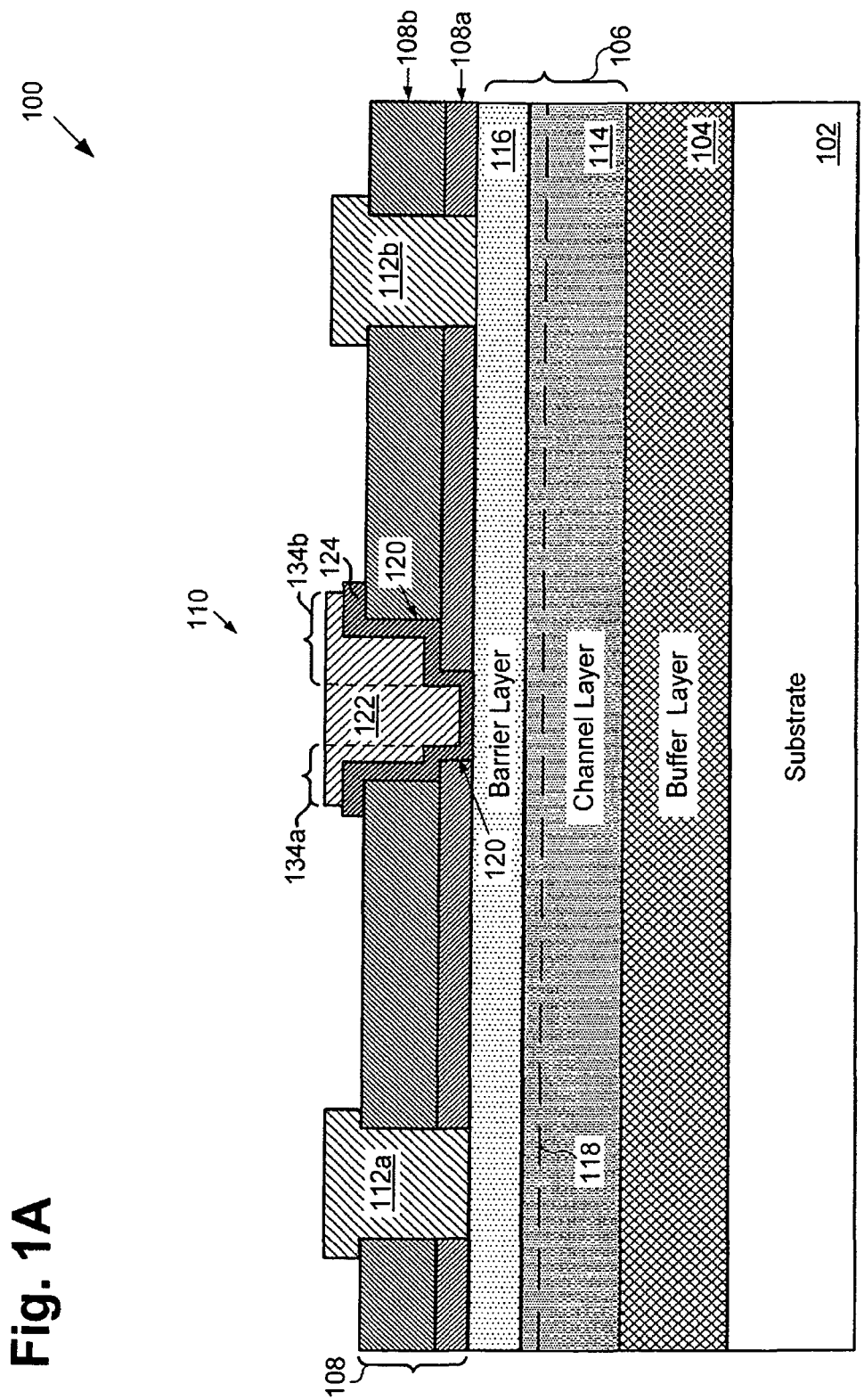
FIG. 1A presents a cross-sectional view of a portion of an exemplary III-nitride semiconductor device, in accordance with one implementation of the present disclosure.

The following description contains specific information pertaining to implementations in the present disclosure. The drawings in the present application and their accompanying detailed description are directed to merely exemplary implementations. Unless noted otherwise, like or corresponding elements among the figures may be indicated by like or corresponding reference numerals. Moreover, the drawings and illustrations in the present application are generally not to scale, and are not intended to correspond to actual relative dimensions.

FIG. 1A presents a cross-sectional view of a portion of an exemplary III-nitride semiconductor device, in accordance with one implementation of the present disclosure. In FIG. 1A, III-nitride semiconductor device 100 is a transistor (e.g. a high-electron-mobility transistor), and may be an enhancement mode or depletion mode transistor. III-nitride semiconductor device 100 includes substrate 102, buffer layer 104, III-nitride heterojunction 106, dielectric body 108, gate arrangement 110, and ohmic electrodes 112a and 112b.

In the present implementation, buffer layer 104 includes AlN, by way of example, and is formed over substrate 102. Substrate 102 is a silicon substrate in the present implementation, however other substrate materials can be utilized. III-nitride semiconductor device 100 can include other layers not specifically shown in FIG. 1A, such as transition layers configured to manage stress between substrate 102 and III-nitride body 114. Other examples include spacer layers and cap layers.

III-nitride heterojunction 106 is formed over buffer layer 104 and includes III-nitride body 116 situated over III-nitride body 114 to form a two-dimensional electron gas (2DEG) 118. III-nitride body 114 may also be referred to as a channel layer and III-nitride body 116 may also be referred to as a barrier layer, as shown in FIG. 1A. The composition of III-nitride bodies 114 and 116 are selected to cause formation 2DEG 118, which is rich in carriers and forms a conduction channel between ohmic electrodes 112a and 112b. III-nitride body 114 includes semiconductor material of one bandgap, and III-nitride body 116 includes semiconductor material of another bandgap. In the present implementation, III-nitride body 114 includes GaN and III-nitride body 116 includes AlGaN. However, other semiconductor materials may be utilized, such as other group III-V semiconductor materials (e.g. III-Nitride materials).

Also in FIG. 1A, ohmic electrodes 112a and 112b are ohmically coupled to III-nitride body 116 and are thereby electrically coupled to 2DEG 118. Ohmic electrodes 112a and 112b extend through dielectric body 108 to contact III-nitride body 116. As shown, ohmic electrodes 112a and 112b are optionally situated in respective trenches in dielectric body 108. In III-nitride semiconductor device 100, ohmic electrode 112a is a source electrode and ohmic electrode 112b is a drain electrode.

Also in the present implementation, dielectric body 108 is situated over III-nitride heterojunction 106 and includes dielectric layer 108a of a first dielectric material and dielectric layer 108b of a second dielectric material different than the first dielectric material. Dielectric body 108 is configured to passivate III-nitride body 116. As such, dielectric body 108 can be referred to as a passivation body in some implementations. In one implementation, dielectric layer 108a is an oxide and dielectric layer 108b is a nitride. In another implementation, dielectric layer 108a is a nitride and dielectric layer 108b is an oxide. Silicon Oxide ($SiO_2$) is an example of a material suitable for the oxide and silicon nitride ($Si_xN_y$) is an example of a material suitable for the nitride. Although not shown in FIG. 1A, dielectric body 108 can include one or more additional dielectric layers. The one or more additional dielectric layers can be of a third dielectric material different than the first or second dielectric materials. However, in one implementation, an additional dielectric layer is situated over dielectric layer 108b and is of the first dielectric material. In some implementations, dielectric body 108 alternates between dielectric layers of the first and second dielectric materials.

Figure 1B:
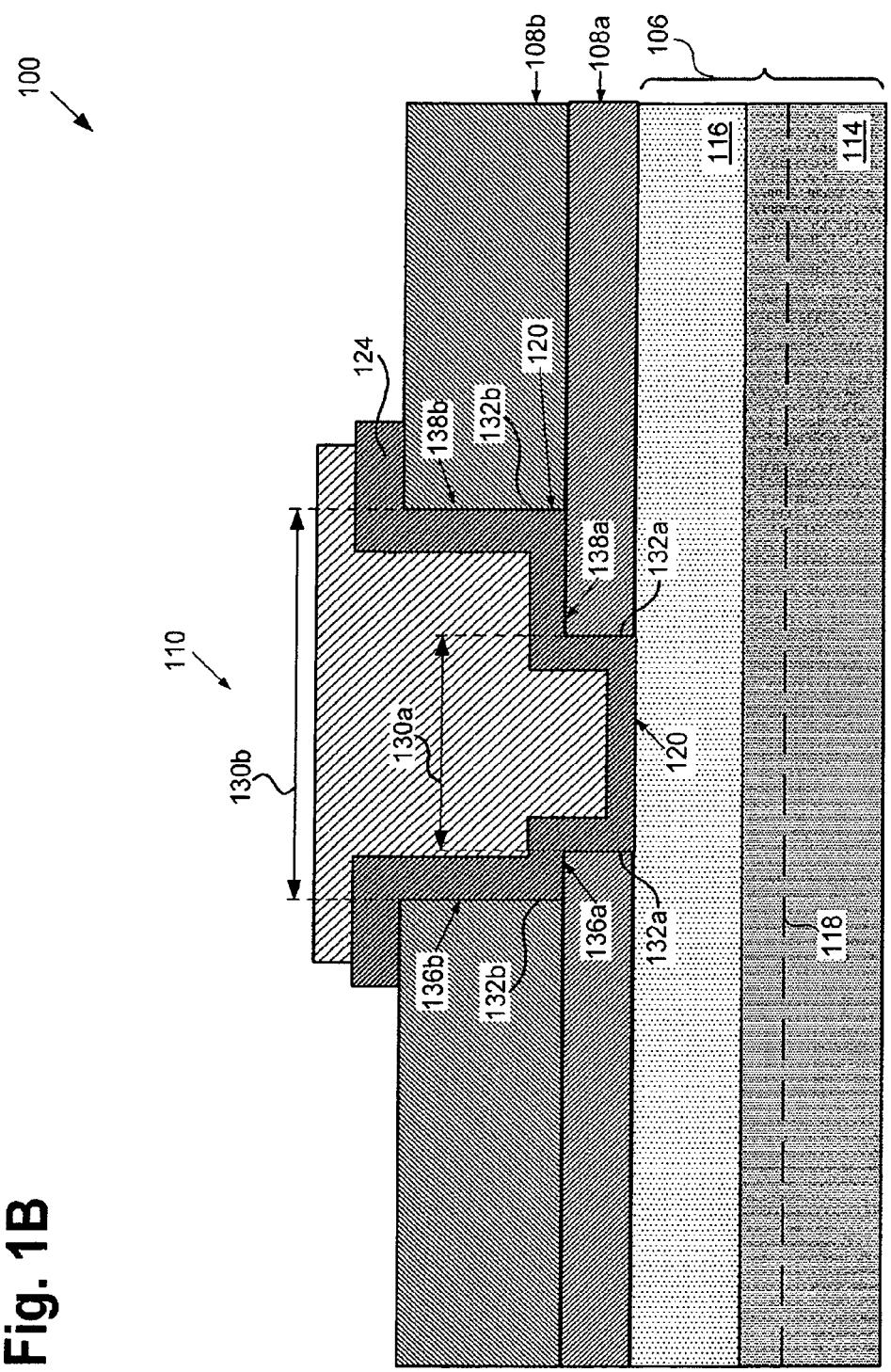
FIG. 1B presents an enhanced cross-sectional view of a portion of an exemplary III-nitride semiconductor device, in accordance with one implementation of the present disclosure.

Gate well 120 is defined by dielectric body 108 and extends through dielectric body 108 to contact III-nitride layer 116. As shown, gate well 120 is formed in dielectric body 108 and is defined by dielectric layers 108a and 108b of dielectric body 108. Referring now to FIG. 1B, FIG. 1B presents an enhanced cross-sectional view of the portion of the exemplary III-nitride semiconductor device shown in FIG. 1A. FIG. 1B shows gate well 120 being of width 130a defined by dielectric layer 108a, and being of width 130b defined by dielectric layer 108b.

As shown in FIG. 1B, width 130a is defined by opening 132a in dielectric layer 108a. Furthermore, width 130b is defined by opening 132b in dielectric layer 108b. It is noted that in some implementations, dielectric body 108 can be a single dielectric layer and openings opening 132a and 132b can be in the single layer. Furthermore, dielectric body 108 may include additional dielectric layers, such that any of openings 132a and 132b can be in multiple dielectric layers.

In the present implementation, ledges 136a and 138a of dielectric layer 108a define width 130a of gate well 120 as well as opening 132a. Also, sidewalls 136b and 138b of dielectric layer 108b define width 130b of gate well 120 as well as opening 132b. Width 130b is greater than width 130a, such that gate well 120 expands in width away from III-nitride heterojunction 106. Thus, opening 132b in dielectric layer 108b is wider than opening 132a in dielectric layer 108a.

Gate arrangement 110 includes gate electrode 122 situated in gate well 120. Gate electrode 122 is disposed between ohmic electrodes 112a and 112b and is configured to selectively modulate 2DEG 118, whereby III-nitride semiconductor device 100 may be operated as a switch. Gate electrode 122 can make Schottky contact with III-nitride heterojunction 106. However, in the present implementation, gate arrangement 110 includes gate dielectric 124, such that gate electrode 122 makes capacitive contact with III-nitride heterojunction 106. Gate dielectric 124 is situated in and lines gate well 120. Suitable materials for gate dielectric 124 include silicon nitride ($Si_xN_y$) and/or other suitable gate dielectric material or materials.

In gate arrangement 110, gate electrode 122 is integrated with at least one field plate. For example, FIG. 1A shows gate electrode 122 as being integrated with field plates 134a and 134b. Field plates 134a and 134b are situated over dielectric layer 108a. Gate dielectric 124 and/or any of field plates 134a and 134b can optionally extend out from gate well 120, as shown in FIGS. 1A and 1B. Thus, as shown, field plates 134a and 134b are also situated over dielectric layer 108b. Also, a side of gate well 120 without a corresponding field plate may be substantially parallel to an adjacent side of gate electrode 122, as no ledge is required.

Field plate 134a is situated between gate electrode 122 and ohmic electrode 112a, which is a source electrode. Thus, field plate 134a may be referred to as a source-side field plate. Field plate 134b is situated between gate electrode 122 and ohmic electrode 112b, which is a drain electrode. Thus, field plate 134b may be referred to as a drain-side field plate. It is noted that various implementations may include only one of field plates 134a and 134b.

Gate electrode 122 is situated in opening 132a in dielectric layer 108a, and field plates 134a and 134b are situated in opening 132b in dielectric layer 108b. In the implementation shown, gate arrangement 110 fills opening 132a in dielectric layer 108a and opening 132b in dielectric layer 108b. More particularly, gate electrode 122, field plates 134a and 134b, and optionally gate dielectric 124 collectively fill gate well 120. By integrating field plates 134a and 134b with gate electrode 122, overlap between gate electrode 122 and 2DEG 118 can be decreased thereby reducing gate-drain charge (Qgd) for III-nitride semiconductor device 100. Furthermore, field plates 134a and 134b alleviate high electric fields that would otherwise form from sharp corners of gate electrode 122, thereby increasing breakdown voltage of III-nitride semiconductor device 100.

In some implementations, one of the ledges, for example, ledge 138a that is closer to ohmic electrode 112b (e.g. a drain electrode) may be wider than ledge 136a, which is closer to ohmic electrode 112a (e.g. a source electrode). The width of each ledge is in the lateral dimension inside gate well 120. Doing so can further improve breakdown voltage of III-nitride semiconductor device 100. Ledge 138a can be between approximately 2 to approximately 4 times as wide as ledge 136a, by way of example. In the implementation shown, ledge 136a is approximately 0.025 μm wide and ledge 138a is between approximately 0.05 μm to 0.1 μm wide. As a result, field plate 134b may be wider than field plate 134a, as shown. The portion of field plate 134b over only dielectric layer 108a of dielectric body 108 is wider than the portion of field plate 134a over only dielectric layer 108a of dielectric body 108. However, the portion of field plate 134b over both dielectric layers 108a and 108b can also be wider than the portion of field plate 134a over both dielectric layers 108a and 108b.

Figure 2:
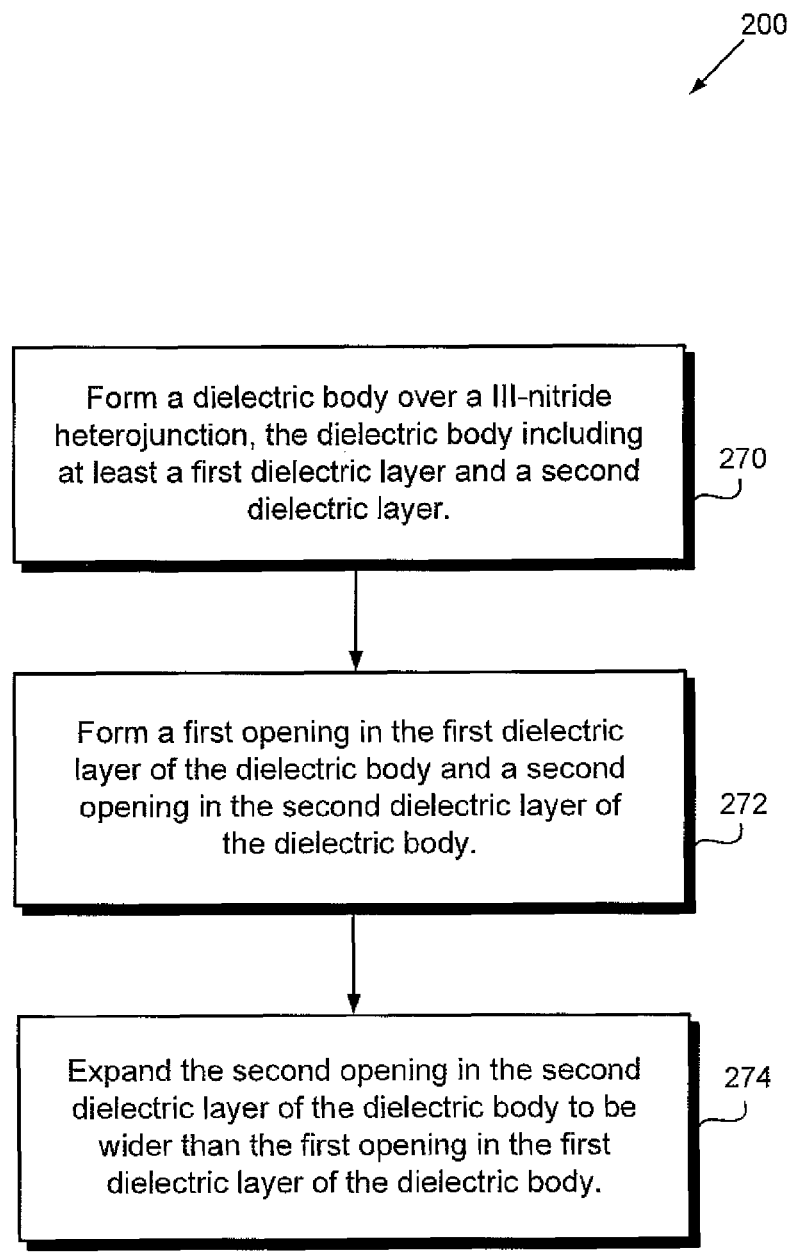
FIG. 2 shows a flowchart illustrating an exemplary method for fabricating a III-nitride semiconductor device, in accordance with one implementation of the present disclosure.

FIG. 2 shows a flowchart illustrating an exemplary method for fabricating a III-nitride semiconductor device, in accordance with one implementation of the present disclosure. The approach and technique indicated by flowchart 200 are sufficient to describe at least one implementation of the present disclosure, however, other implementations of the disclosure may utilize approaches and techniques different from those shown in flowchart 200. Furthermore, while flowchart 200 is described with respect to FIGS. 3A, 3B, and 3C, disclosed inventive concepts are not intended to be limited by specific features shown and described with respect to FIGS. 3A, 3B, and 3C. Furthermore, with respect to the method illustrated in FIG. 2, it is noted that certain details and features have been left out of flowchart 200 in order not to obscure discussion of inventive features in the present application. Furthermore, implementations illustrated by flowchart 200 are performed on a processed wafer, which, includes, amongst other things, a substrate, a III-nitride heterojunction, and a buffer layer, and or other features, such as transition layers and/or spacer layers. The wafer may also be referred to as a semiconductor die or simply a die in the present application.

Figure 3A:
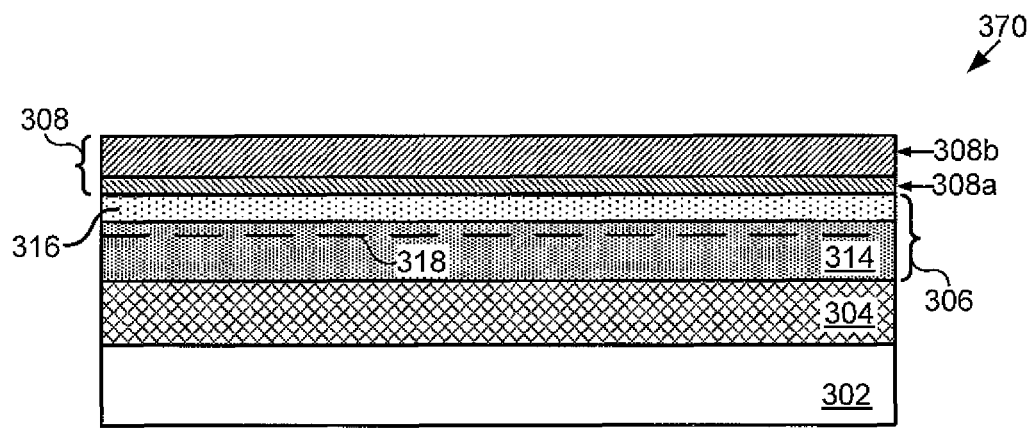
FIG. 3A illustrates a cross-sectional view, which includes a portion of an exemplary wafer processed according to an implementation disclosed in the present application.

Referring now to flowchart 200 of FIG. 2 and FIG. 3A, flowchart 200 includes forming a dielectric body over a III-nitride heterojunction, the dielectric body including at least a first dielectric layer and a second dielectric layer (270 in FIG. 2). As shown in FIG. 3A, structure 370 includes substrate 302, buffer layer 304, III-nitride heterojunction 306, and dielectric body 308 corresponding respectively to substrate 102, buffer layer 104, III-nitride heterojunction 106, and dielectric body 108 in FIGS. 1A and 1B during fabrication of III-nitride semiconductor device 100. III-nitride heterojunction 306 includes III-nitride bodies 314 and 316 corresponding respectively to III-nitride bodies 114 and 116 in FIGS. 1A and 1B during fabrication of III-nitride semiconductor device 100.

In forming structure 370, buffer layer 304, such as AlN, can be grown over substrate 302 such as a silicon substrate, a silicon carbide substrate, a sapphire substrate, or the like. Buffer layer 304 may not be necessary if substrate 302 is compatible with III-nitride body 314. As one example, buffer layer 304 may not be necessary if substrate 302 is a GaN substrate. After buffer layer 304 is formed, III-nitride body 314, for example, GaN, can be grown over buffer layer 304, followed by growth of III-nitride body 316, for example, AlGaN, to obtain 2DEG 318, corresponding to 2DEG 118 in FIGS. 1A and 1B.

Thereafter, dielectric body 308 is formed over III-nitride heterojunction 306, buffer layer 304, and substrate 302. Dielectric body 308 includes at least dielectric layer 308a and dielectric layer 308b corresponding respectively to dielectric layer 108a and dielectric layer 108b in FIGS. 1A and 1B during fabrication of III-nitride semiconductor device 100. Forming dielectric body 308 can include growing or depositing dielectric layer 308a of a first dielectric material over III-nitride heterojunction 306 and growing or depositing dielectric layer 308b of a second dielectric material over dielectric layer 308a.

The first and second dielectric materials can optionally be different dielectric materials, such as in the present implementation. For example, the first and second dielectric materials can be selected such that an enchant capable of removing portions of dielectric layer 308b does not remove portions of dielectric layer 308a (i.e. the enchant is selective to dielectric layer 308b). Examples of suitable materials for dielectric layer 308a include field dielectrics, such as AlN and $Si_xN_y$. Dielectric layer 308a can be approximately 0.05 μm to approximately 0.1 μm thick, by way of example.

Figure 3B:
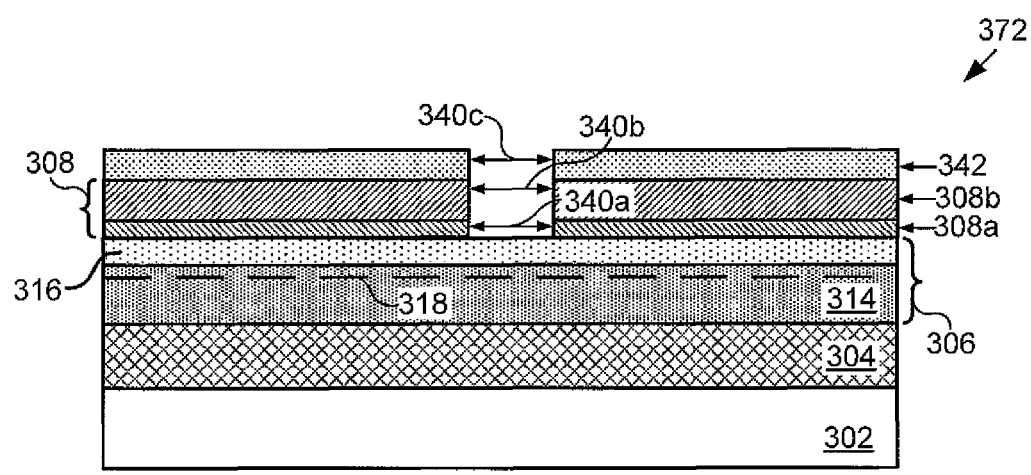
FIG. 3B illustrates a cross-sectional view, which includes a portion of an exemplary wafer processed according to an implementation disclosed in the present application.

Referring now to flowchart 200 of FIG. 2 and FIG. 3B, flowchart 200 includes forming a first opening in the first dielectric layer of the dielectric body and a second opening in the second dielectric layer of the dielectric body (272 in FIG. 2). As shown in FIG. 3B, structure 372 includes opening 340a in dielectric layer 308a and opening 340b in dielectric layer 308b.

In forming structure 372, mask 342 (e.g. a photoresist mask) can be deposited over dielectric body 308 of structure 370. Mask 342 can be patterned (e.g. utilizing photolithography) to form opening 340c over dielectric body 308. Thereafter, openings 340a and 340b can be formed in dielectric layers 308a and 308b by etching through dielectric layers 308a and 308b. The etch is isotropic in some implementations. Thus, openings 340a and 340b may form substantially vertical sidewalls in dielectric body 308, as shown.

Figure 3C:
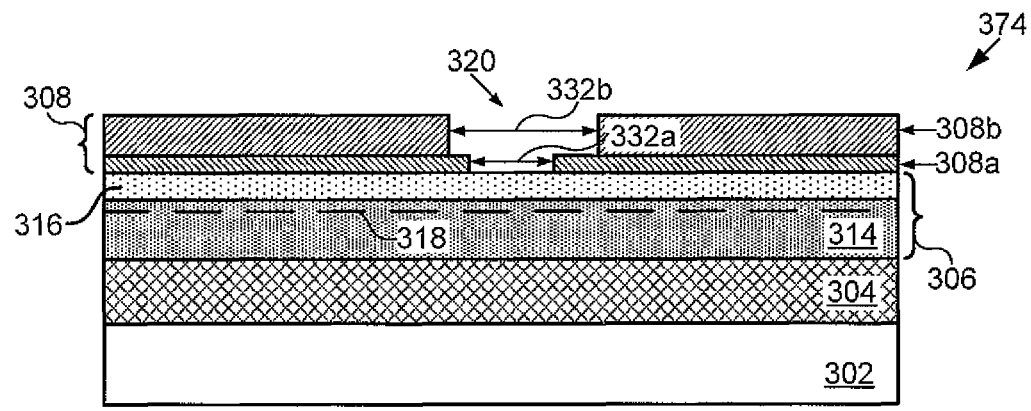
FIG. 3C illustrates a cross-sectional view, which includes a portion of an exemplary wafer processed according to an implementation disclosed in the present application.

Referring now to flowchart 200 of FIG. 2 and FIG. 3C, flowchart 200 includes expanding the second opening in the second dielectric layer of the dielectric body to be wider than the first opening in the first dielectric layer of the dielectric body (274 in FIG. 2). As shown in FIG. 3B, structure 374 opening 332b in dielectric layer 308b of dielectric body 308 is wider than and opening 332a in dielectric layer 308a of dielectric body 308.

In forming structure 374, mask 342 can be removed from structure 372, and a second mask and a second etch can be utilized to remove portions of dielectric layer 308b from the substantially vertical sidewalls formed in dielectric body 308. In doing so, gate well 320 can be formed corresponding to gate well 120 in FIGS. 1A and 1B. Thus, openings 332a and 332b can correspond respectively to openings 132a and 132b in FIGS. 1A and 1B. Subsequently, gate dielectric 124, gate electrode 122, and ohmic electrodes 112a and 112b may be formed so as to result in III-nitride semiconductor device 100 in FIGS. 1A and 1B. The second mask can be offset from the center opening 340c in mask 342 so that one of ledges 136a and 138a is wider than the other of ledges 136a and 138a.

As dielectric layer 308a includes a first dielectric material that is different than a second dielectric material of dielectric layer 308b, the second etch can be selective to dielectric layer 308b. As such, opening 340a of FIG. 3B can be substantially identical to opening 332a of FIG. 3C.

As an alternative, a single etch may be performed on structure 370 of FIG. 3A by utilizing an enchant, which etches dielectric layers 308a and 308b at different rates (i.e. etches dielectric layer 308b faster than dielectric layer 308a) to obtain structure 374 of FIG. 3C. As dielectric layer 308a includes a first dielectric material that is different than a second dielectric material of dielectric layer 308b, the single etch can occur at different rates on dielectric layers 308a and 308b. As such, the second mask and etch may be avoided. Thus, it will be appreciated that 272 and 274 in flowchart 200 of FIG. 2 can be concurrent, in some implementations.

Such implementations may still include forming mask 342 of FIG. 3B with opening 340c, as described above.

Figure 4:
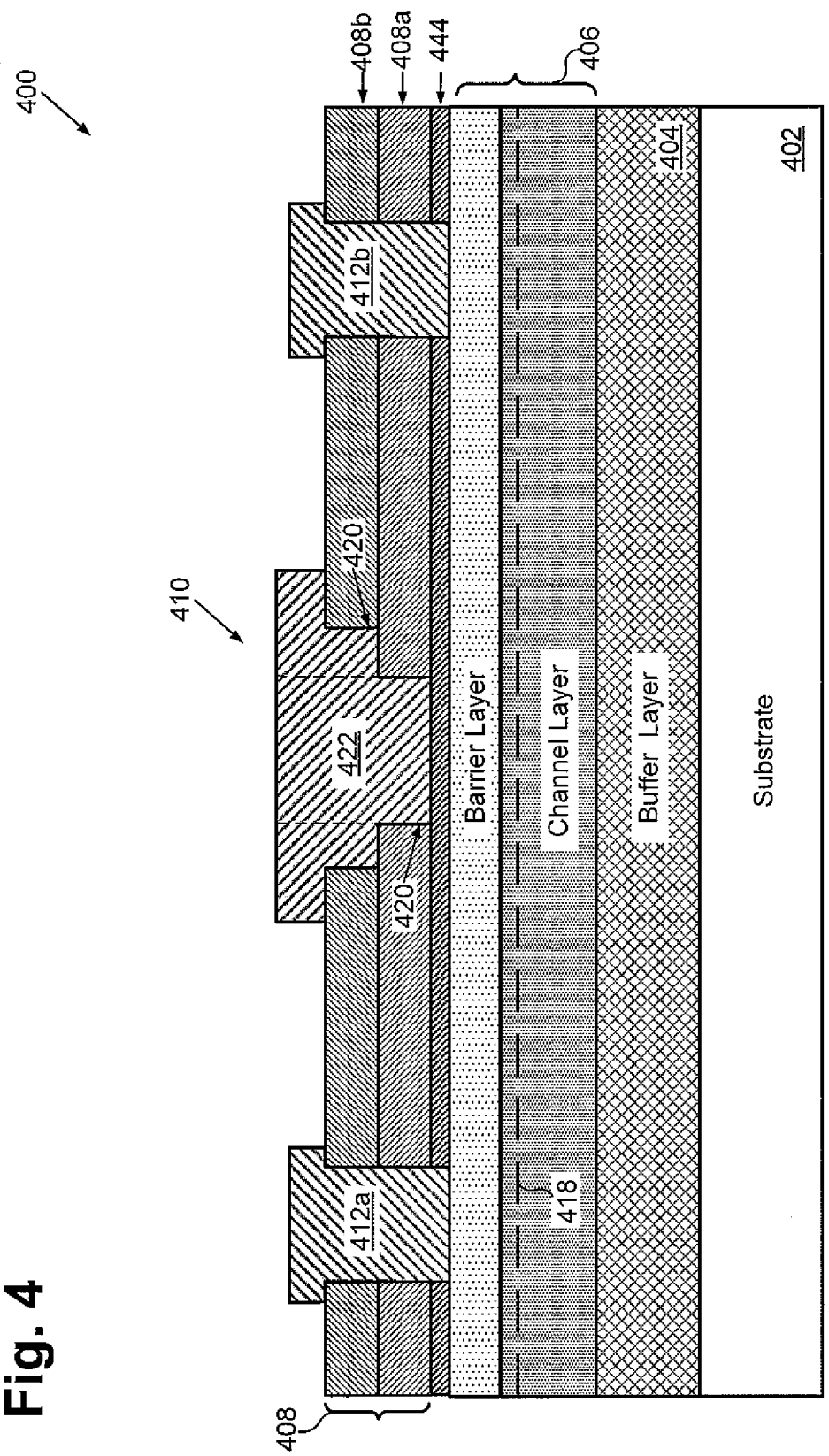
FIG. 4 presents a cross-sectional view of a portion of an exemplary III-nitride semiconductor device, in accordance with one implementation of the present disclosure.

While in implementations described above gate dielectric 124 is formed in gate well 120, in other implementations, gate well 120 is formed over gate dielectric 124. Referring now to FIG. 4, FIG. 4 presents a cross-sectional view of a portion of an exemplary III-nitride semiconductor device, in accordance with one implementation of the present disclosure.

In III-nitride semiconductor device 400, substrate 402, buffer layer 404, III-nitride heterojunction 406, dielectric body 408, ohmic electrodes 412a and 412b, gate well 420, and gate electrode 422 correspond respectively to buffer layer 104, III-nitride heterojunction 106, dielectric body 108, ohmic electrodes 112a and 112b, gate well 120, and gate electrode 122 in FIGS. 1A and 1B. Thus, III-nitride semiconductor device 400 can be similar to III-nitride semiconductor device 100 in FIGS. 1A and 1B. However, in gate arrangement 410 of III-nitride semiconductor device 400, gate dielectric 444 is situated below gate well 420. As one example, III-nitride semiconductor device 400 can be fabricated-similar to III-nitride semiconductor device 100 by forming gate dielectric 444 over III-nitride heterojunction 406 prior to 270 in flowchart 200 of FIG. 2.

FIGS. 1A, 1B, 2, 3A, 3B, 3C, and 4 describe implementations in which a gate well is defined by two openings in a dielectric body. In doing so, a field plate can have a step defined in the dielectric body. However, the gate well can be defined by more than two openings in the dielectric body, an example of which is shown and described below with respect to FIGS. 5A and 5B. Doing so can provide for a field plate having additional steps defined by the dielectric body, which allows for enhanced active area shaping of a III-nitride semiconductor device.

Figure 5A:
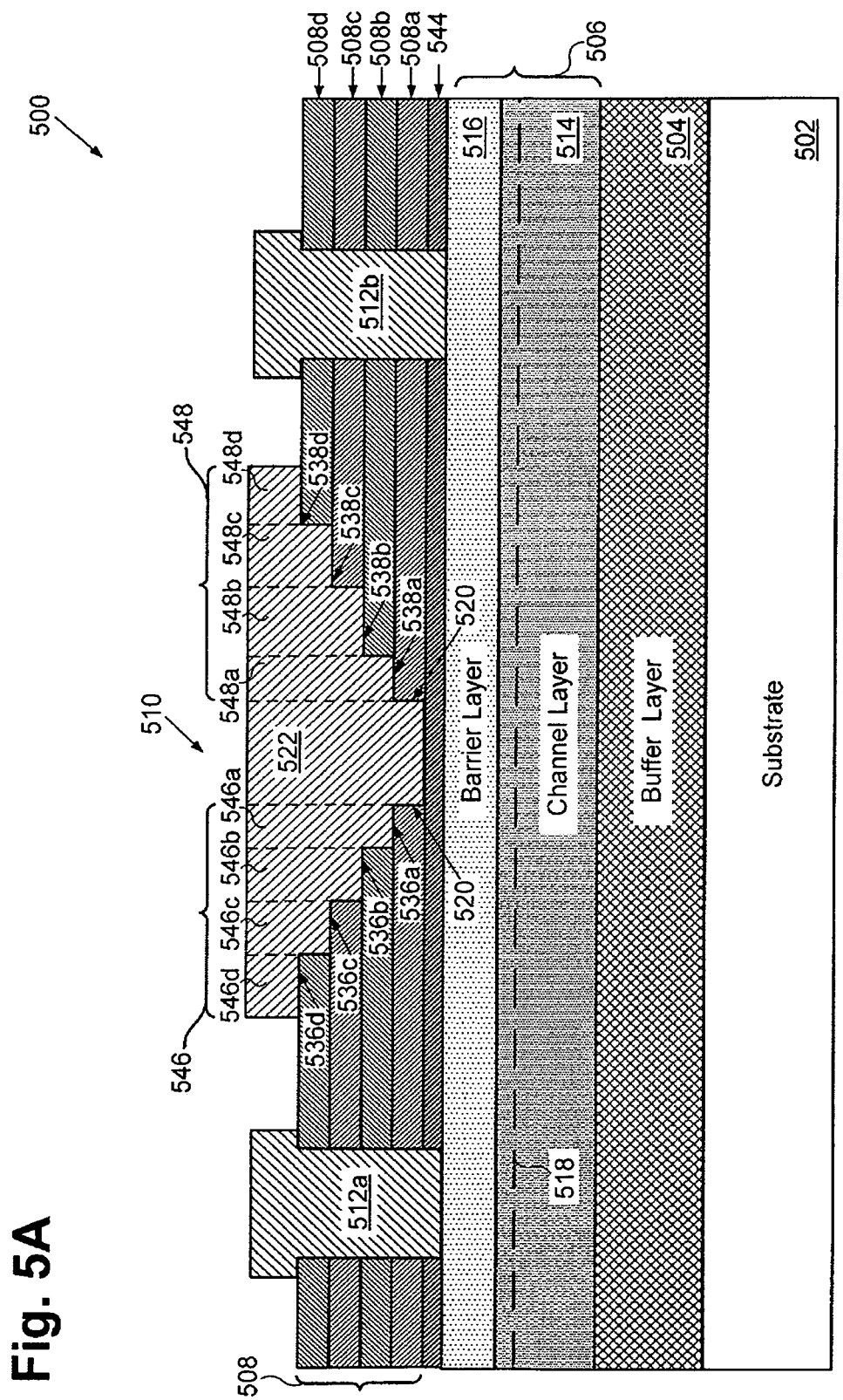
FIG. 5A presents a cross-sectional view of a portion of an exemplary III-nitride semiconductor device, in accordance with one implementation of the present disclosure.
Figure 5B:
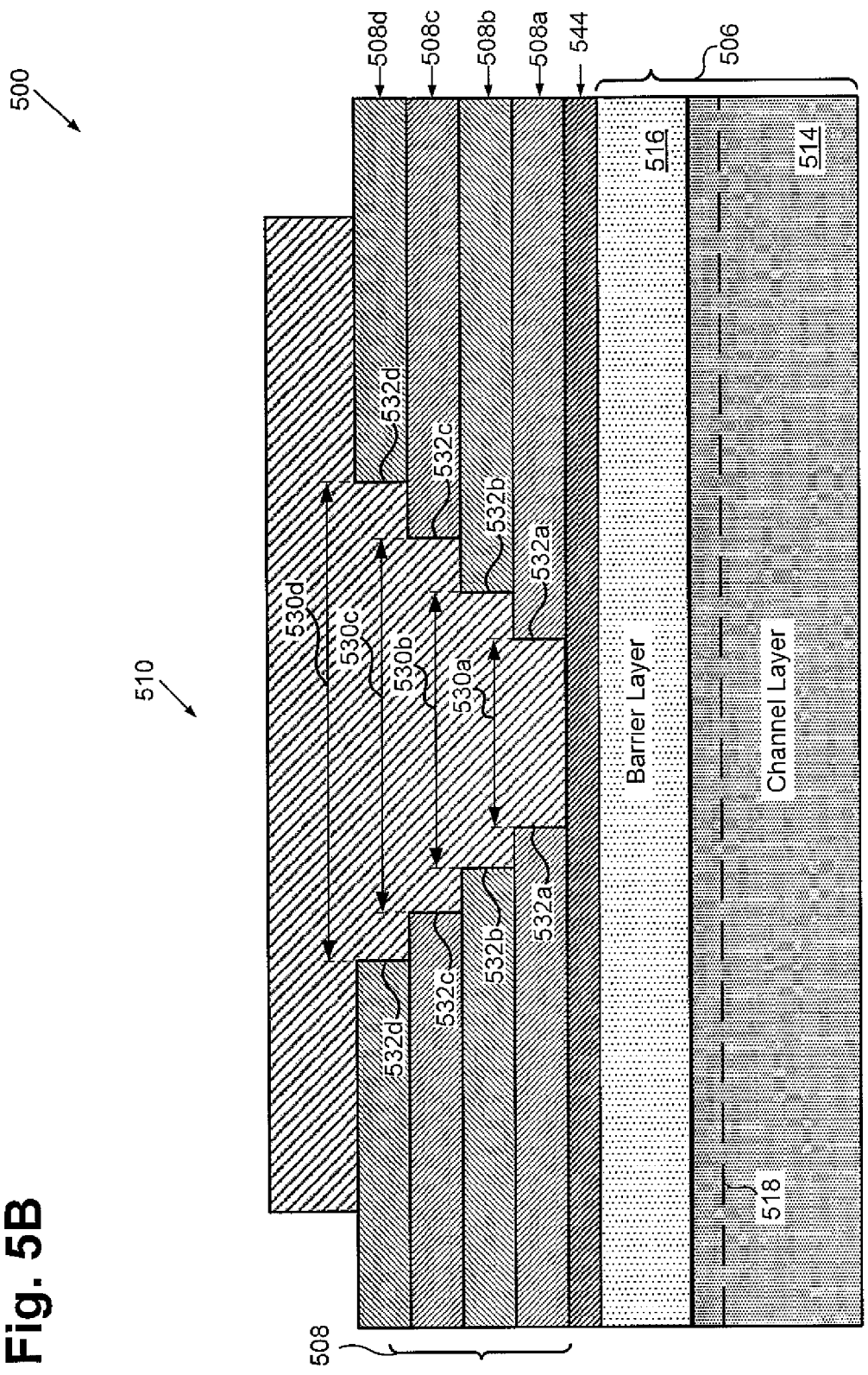
FIG. 5B presents an enhanced cross-sectional view of a portion of an exemplary III-nitride semiconductor device, in accordance with one implementation of the present disclosure.

FIG. 5A presents a cross-sectional view of a portion of an exemplary III-nitride semiconductor device, in accordance with one implementation of the present disclosure. FIG. 5B presents an enhanced cross-sectional view of the portion of the exemplary III-nitride semiconductor device of FIG. 5A. In FIGS. 5A and 5B, III-nitride semiconductor device 500 includes substrate 502, buffer layer 504, III-nitride heterojunction 506, dielectric body 508, gate arrangement 510, ohmic electrodes 512a and 512b, and gate well 520 corresponding respectively to substrate 102, buffer layer 104, III-nitride heterojunction 106, dielectric body 108, gate arrangement 110, ohmic electrodes 112a and 112b, and gate well 120 in FIGS. 1A and 1B.

III-nitride heterojunction 506 is formed over buffer layer 504 and includes III-nitride body 516 situated over III-nitride body 514 to form a two-dimensional electron gas (2DEG) 518. III-nitride bodies 514 and 516 and 2DEG 518 correspond respectively to III-nitride bodies 114 and 116 and 2DEG 118 in FIGS. 1A and 1B.

Gate arrangement 510 includes gate electrode 522 and field plates 546 and 548 corresponding respectively to gate electrode 122 and field plates 134a and 134b in FIGS. 1A and 1B. Thus, field plate 546 is a source-side field plate and field plate 548 is a drain-side field plate. Gate arrangement 510 also includes gate dielectric 544 corresponding to gate dielectric 444 in FIG. 4. While gate dielectric 544 is situated below gate well 520, similar to gate dielectric 444 in FIG. 4, in other implementations, gate dielectric 544 can be situated in and line gate well 520, similar to gate dielectric 124 in FIGS. 1A and 1B.

In III-nitride semiconductor device 500, dielectric body 508 includes dielectric layers 508a, 508b, 508c, and 508d (i.e. a plurality of dielectric layers). In other implementations, dielectric body 508 may include more or fewer dielectric layers. Dielectric layers 508a and 508b can correspond to dielectric layers 108a and 108b in dielectric body 108 of III-nitride semiconductor device 100. Thus, dielectric body 508 can include, for example, at least one silicon nitride layer and at least one silicon oxide layer. Dielectric layers 508c and 508d can be any suitable dielectric material, such as those described with respect to dielectric layers 108a and 108b.

In some implementations, dielectric layer 508c is of the same dielectric material as dielectric layer 508a and dielectric layer 508d is of the same dielectric material as dielectric layer 508b. In other implementations, dielectric layers 508a, 508b, 508c, and 508d are different dielectric materials from one another. Thus, in some implementations, gate well 520 may be formed utilizing an enchant, which etches any of dielectric layers 508a, 508b, 508c, and 508d at different rates from others of dielectric layers 508a, 508b, 508c, and 508d, such as has been described with respect to flowchart 200. However, one or more masks may be utilized to define the width of any of dielectric layers 508a, 508b, 508c, and 508d as well.

Referring to FIG. 5A, field plate 546 includes steps 546a, 546b, 546c, and 546d defined by dielectric body 508. Field plate 548 includes steps 548a, 548b, 548c, and 548d defined by dielectric body 508. By including field plates having at least two steps defined by a dielectric body, III-nitride semiconductor device 500 can achieve enhanced active area shaping including well-defined electric fields.

Referring to FIG. 5A with FIG. 5B, steps 546a, 546b, and 546c of field plate 546 are defined by openings 532b, 532c, and 532d in dielectric layers 508a, 508b, 508c, and 508d. Steps 548a, 548b, and 548c of field plate 548 are also defined by openings 532b, 532c, and 532d in dielectric layers 508a, 508b, 508c, and 508d. Each step may be defined by a respective opening in dielectric body 508, as shown. For example, step 546a is defined by opening 530b.

Steps 546a, 546b, 546c, and 546d of field plate 546 are further defined by ledges 536a, 536b, 536c, and 536d of dielectric body 508. Steps 548a, 548b, 548c, and 548d of field plate 548 are also defined by ledges 538a, 538b, 538c, and 538d of dielectric body 508. Each step may be defined by a respective ledge of dielectric body 508, as shown. For example, step 548a is defined by ledge 538a of dielectric body 508. Although not shown in FIGS. 5A and 5B field plate 548 may be wider than field plate 546, similar to what is shown in FIGS. 1A and 1B. This may be accomplished where any of ledges 538a, 538b, 538c, and 538d are wider than any of ledges 536a, 536b, 536c, and 536d.

Gate well 520 is of width 530a defined by dielectric layer 508a, width 530b defined by dielectric layer 508b, width 530c defined by dielectric layer 508c, and width 530d defined by dielectric layer 508d. Width 530b is greater than width 530a, width 530c is greater than width 530b, and width 530d is greater than width 530c, such that gate well 520 expands in width away from III-nitride heterojunction 506. As gate arrangement 510 fills gate well 520, gate arrangement 510 also expands away from III-nitride heterojunction 506 so as to ease electric fields thereunder.

Thus, as described above with respect to FIGS. 1A, 1B, 2, 3A, 3B, 3C, 4, 5A, and 5B, implementations of the present disclosure can utilize a dielectric body to allow for III-nitride semiconductor devices with decreased overlap between a gate electrode and 2DEG, thereby reducing Qgd. Furthermore, high electric fields that would otherwise form from sharp corners of the gate electrode can be alleviated, thereby increasing breakdown voltage of the III-nitride semiconductor device. Also, a field plate including at least two steps can be defined in the dielectric body so as to enhance active area shaping of the III-nitride semiconductor device.

From the above description it is manifest that various techniques can be used for implementing the concepts described in the present application without departing from the scope of those concepts. Moreover, while the concepts have been described with specific reference to certain implementations, a person of ordinary skill in the art would recognize that changes can be made in form and detail without departing from the scope of those concepts. As such, the described implementations are to be considered in all respects as illustrative and not restrictive. It should also be understood that the present application is not limited to the particular implementations described above, but many rearrangements, modifications, and substitutions are possible without departing from the scope of the present disclosure.

The invention claimed is:

1. A III-nitride semiconductor device comprising:
   a III-nitride heterojunction including a first III-nitride body situated over a second III-nitride body to form a two-dimensional electron gas;
   a single gate dielectric layer situated over said III-nitride heterojunction;
   a gate well formed in a dielectric body, said dielectric body comprising a first dielectric material and a second dielectric material and being situated over said III-nitride heterojunction and said single gate dielectric layer;
   first and second ohmic electrodes extending through said dielectric body and said single gate dielectric layer to contact said III-nitride heterojunction;
   a gate arrangement situated in said gate well and comprising a gate electrode and a field plate;
   said field plate comprising at least three steps situated within said gate well, said at least three steps being defined in said first dielectric material and said second dielectric material of said dielectric body;
   wherein at least one of said at least three steps is wider than another of said at least three steps,
   wherein said dielectric body comprises a plurality of dielectric layers each formed from one of said first dielectric material and said second dielectric material.

2. The III-nitride semiconductor device of claim 1, wherein each step of said at least three steps is defined by a respective opening in said dielectric body.

3. The III-nitride semiconductor device of claim 1, wherein said dielectric body comprises at least one silicon nitride layer and at least one silicon oxide layer.

4. The III-nitride semiconductor device of claim 1, wherein said at least three steps are defined by ledges of said dielectric body.

5. The III-nitride semiconductor device of claim 1, wherein each step of said at least three steps is defined by a respective ledge of said dielectric body.

6. The III-nitride semiconductor device of claim 1, wherein said field plate is a drain-side field plate.

7. The III-nitride semiconductor device of claim 1, wherein said gate well is of a first width defined by a first dielectric layer of said dielectric body, and is of a second width defined by a second dielectric layer of said dielectric body, said second width being greater than said first width.

8. The III-nitride semiconductor device of claim 1, wherein said gate arrangement fills said gate well.

9. The III-nitride semiconductor device of claim 1, wherein said field plate is a drain-side field plate and further comprising a source-side field plate comprising at least another three steps, said at least another three steps being defined in said dielectric body.

10. A III-nitride semiconductor device comprising:
    a III-nitride heterojunction including a first III-nitride body situated over a second III-nitride body to form a two-dimensional electron gas;
    a single gate dielectric layer situated over said III-nitride heterojunction;
    a gate well defined by openings in a plurality of dielectric layers, each of said plurality of dielectric layers being formed of one of a first dielectric material and a second dielectric material and being situated over said III-nitride heterojunction and said single gate dielectric layer;
    first and second ohmic electrodes extending through said plurality of dielectric layers and said single gate dielectric layer to contact said III-nitride heterojunction;
    a gate arrangement situated in said gate well and comprising a gate electrode and a field plate;
    said field plate comprising at least three steps situated within said gate well, said at least three steps being defined by said openings in said plurality of dielectric layers;
    wherein at least one of said at least three steps is wider than another of said at least three steps.

11. The III-nitride semiconductor device of claim 10, wherein each step of said at least three steps is defined by a respective opening in said plurality of dielectric layers.

12. The III-nitride semiconductor device of claim 10, wherein said gate well is of a first width defined by a first dielectric layer of said plurality of dielectric layers, and is of a second width defined by a second dielectric layer of said plurality of dielectric layers, said second width being greater than said first width.

13. The III-nitride semiconductor device of claim 10, wherein each step of said at least three steps is defined by a respective ledge of said plurality of dielectric layers.

14. The III-nitride semiconductor device of claim 10, wherein said field plate is integrated with said gate electrode.

15. The III-nitride semiconductor device of claim 10, wherein said field plate is a drain-side field plate and further comprising a source-side field plate comprising at least another three steps, said at least another three steps being defined by said openings in said plurality of dielectric layers.

16. The III-nitride semiconductor device of claim 15, wherein said drain-side field plate is wider than said source-side field plate.

17. The III-nitride semiconductor device of claim 10, wherein said field plate is situated over said plurality of dielectric layers.

* * * * *